(12) United States Patent
Williams (10) Patent No.: US 10,511,262 B2
(45) Date of Patent: Dec. 17, 2019

(54) HIGH SPEED, HIGH VOLTAGE, AMPLIFIER OUTPUT STAGE USING LINEAR OR CLASS D TOPOLOGY

(71) Applicant: Bruce T. Williams, Barker, NY (US)

(72) Inventor: Bruce T. Williams, Barker, NY (US)

( * ) Notice: Subject to any disclaimer, the term of this patent is extended or adjusted under 35 U.S.C. 154(b) by 0 days.

(21) Appl. No.: 16/192,961

(22) Filed: Nov. 16, 2018

(65) Prior Publication Data
US 2019/0158027 A1    May 23, 2019

Related U.S. Application Data

(60) Provisional application No. 62/588,068, filed on Nov. 17, 2017.

(51) Int. Cl.
| H03F 3/217 | (2006.01) |
| H03F 1/02 | (2006.01) |
| H03F 3/193 | (2006.01) |

(52) U.S. Cl.
CPC ........... *H03F 1/0205* (2013.01); *H03F 3/193* (2013.01); *H03F 3/2171* (2013.01); *H03F 2203/45572* (2013.01)

(58) Field of Classification Search
CPC .......... H03F 1/0205; H03F 3/30; H03F 3/193; H03F 3/2171; H03F 2203/45572; H03F 3/26; H03F 3/3088; H03F 1/22; H03F 3/1935; H03F 2200/372; H03F 3/3001; H03F 3/3022; H03F 3/345; H03F 3/3076; H03F 3/3066; H03F 3/3071; H03F 3/217; H03F 3/2173
USPC ................................ 330/251, 262–264, 277
See application file for complete search history.

(56) References Cited

U.S. PATENT DOCUMENTS

| 4,697,155 A * | 9/1987 | Lehning | ................... H03F 3/426 330/297 |
| 4,859,927 A * | 8/1989 | Meijer | ................... H02M 3/155 323/284 |
| 9,263,935 B2 * | 2/2016 | Kondou | ............... H03K 17/102 |

* cited by examiner

*Primary Examiner* — Khanh V Nguyen
(74) *Attorney, Agent, or Firm* — Ware, Fressola, Maguire & Barber LLP (57) ABSTRACT

Each sub-stage of an amplifier stage includes a resistor coupled to another resistor in an adjacent sub-stage or to a high DC voltage, the resistor and the other resistor forming part of a string of equal valued resistors; an FET having a source coupled to a cathode of a Zener diode coupled in parallel with a capacitor, a drain coupled to another sub-stage in the string, an output node of the amplifier stage, or the high DC voltage; and at least one active device coupled to a gate of the FET and coupled to the resistor for providing high impedance between a voltage on a node of the resistor and the gate of the FET and a low impedance between the at least one active device and the gate of the FET, the at least one active device coupled to both the cathode and an anode of the Zener diode.

16 Claims, 6 Drawing Sheets

HIGH SPEED, HIGH VOLTAGE, AMPLIFIER OUTPUT STAGE USING LINEAR OR CLASS D TOPOLOGY

CROSS-REFERENCE TO RELATED APPLICATION

This application claims the benefit of U.S. Provisional Application No. 62/588,068, filed Nov. 17, 2017, the content of which is hereby incorporated in its entirety by reference.

BACKGROUND OF THE INVENTION

This invention relates to high voltage, amplifier output stage circuitry which is capable of high speed, low cost, and ease of manufacturing. Current art, high voltage D.C. coupled amplifiers are designed with output stages which are composed of multiple High Voltage semiconductor devices, such as High Voltage (H.V.) MOSFET transistors which are connected to fixed H.V. supplies using a cascode configuration. The cascode configuration allows H.V. MOSFET devices to add each of their voltage capabilities to produce a higher amplifier output stage voltage capability which is well beyond the voltage capability of any single MOSFET device comprised in the cascode string connection. For example, the use of, let's say, fifty MOSFET devices each capable of 1 kilovolt drain to source voltage break down limit, could be cascoded to produce a single ended output stage capable of 50 kilovolts output relative to ground potential or a bipolar output of plus or minus 25 kilovolts (50 kilovolts peak-to-peak) relative to ground potential. Of course, the same would be applicable to a unipolar implementation and although bipolar implementations are shown below, it should be understood that the invention is applicable to unipolar implementions.

This is a well-known, conventional technique for producing high voltage capability output stages for D.C. coupled H.V. amplifier systems.

Figure 1:
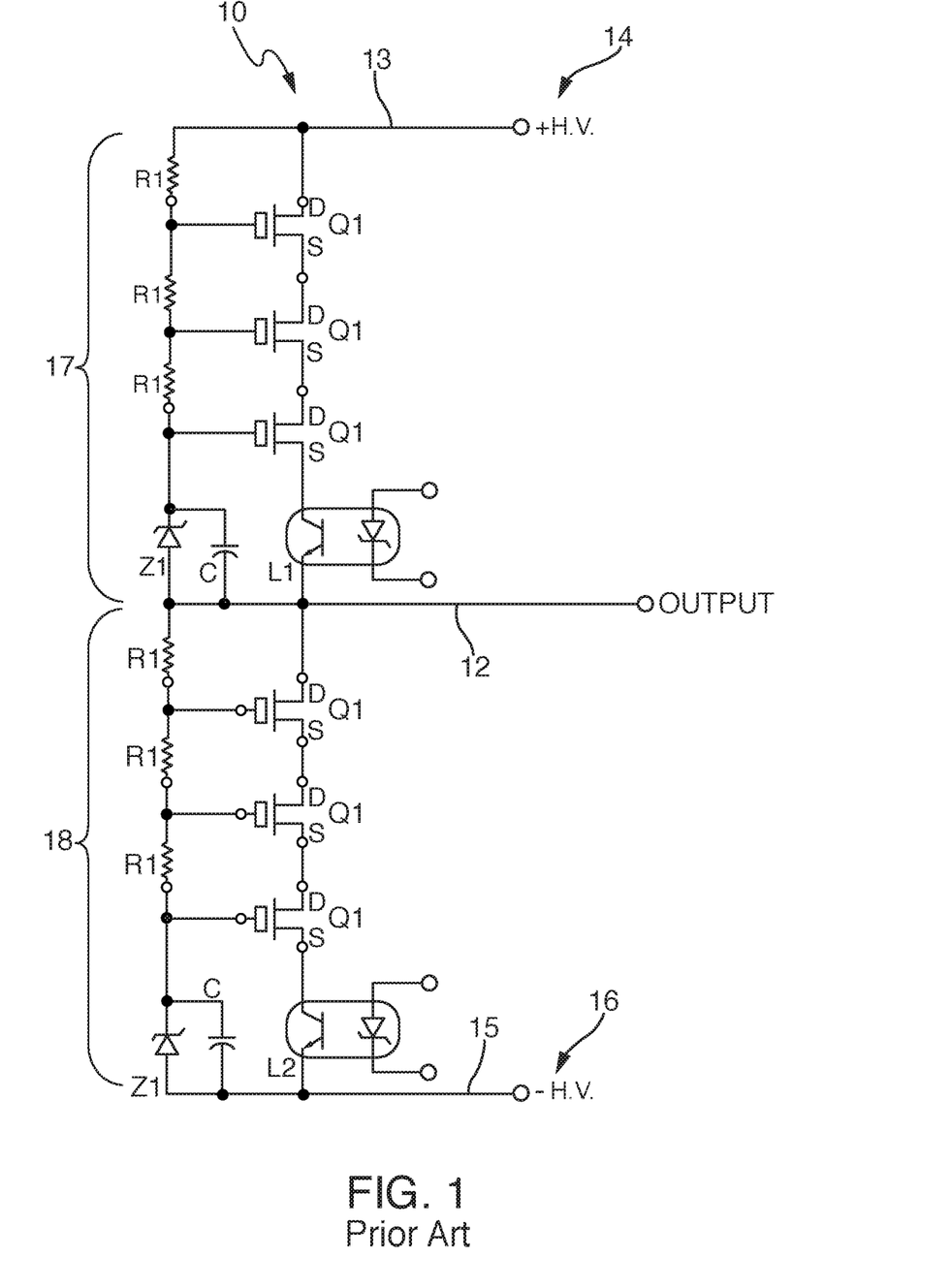
FIG. 1 is a schematic representation of a prior art high voltage D.C. coupled output stage.

FIG. 1 illustrates such a conventional prior art H.V. amplifier output stage configuration 10 using H.V. MOSFET devices. As shown, three H.V. MOSFET devices Q1 are cascoded on each side of the amplifier output terminal 12 and connected at a positive side input line 13 to a (+) H.V. fixed supply 14 and connected at a negative side input line 15 to a (−) H.V. fixed supply 16 to produce a bipolar output capability with a substantially −H.V. to +H.V. output voltage. The H.V. MOSFET devices Q1 may be depletion or enhancement mode power MOSFETs. Linear opto-coupler L1 with H.V. isolation controls the current in a positive side cascode string 17 while linear opto-coupler L2 controls the current in a negative side cascode string 18. In both cases (L1 and L2) an increase in the opto-coupler input diode current results in an increase of the current in the opto-coupler's transistor output into the respective source terminal of the first MOSFET device (Q1) in each of the cascode strings. These increased L1 or L2 currents propagate up the respective cascode string to increase the current in all Q1 devices of the positive output or negative output to increase the current at the output terminal. In this way, the control of the L1 or L2 input diode current from ground referenced low voltage circuitry controls the H.V. output current.

To control the voltage division between each Q1 stage in the respective cascode strings 17, 18, a string of equal value resistors R1 are used to divide the voltage between the output terminal and the (+) H.V. supply as well as the voltage between the (−) H.V. supply and the output terminal. The resistance value depends on the magnitude of the voltage of +H.V. and −H.V. to hold the R1 dissipation to for instance about one-half Watt. The nodes between the resistors in the resistor string also provide the gate voltages to turn on and turn off each of the MOSFET devices Q1. The steady state current required by the Q1 gate circuitry is close to zero current for the MOSFET devices Q1, so the voltage division is adequately precise. Zener Z1 (e.g. a 10V Zener diode) and capacitor C (e.g., 0.1 microfarad) are used to limit the collector voltage on the opto-coupler transistor to prevent breakdown of the transistor device inside the opto-coupler device. If the required linear output current variations at the output, as generated by the L1 and L2 opto-couplers, need to vary relatively slowly over time, this prior art configuration will work well.

However, if increased speed of output current variations is required due to increased frequency response requirements, this prior art system will not operate well and, in some cases, will produce component failure in the Q1 MOSFET devices. This is due to the impedance level of the Q1 gate drive, which is based upon the value of the resistors in the resistor string connected to the gate circuits of the Q1 MOSFET devices, which in the case shown in FIG. 1 is approximately 500 kiloohms as produced by the R1's connected as shown. Whereas, statically, the current required by the Q1 MOSFET devices is practically zero, dynamically, a current is required to be delivered by the resistive string to charge and discharge the capacitance associated with the gate at each of the Q1 MOSFET devices. This input capacitance consists of $C_{gs}$, the gate to source capacitance and $C_{dg}$ the drain to gate capacitance. These two capacitances, appearing in parallel, need to be driven by the approximate 500 kiloohm source impedance. As the capacitance value of $C_{gs}$ is approximately 200 picofarads and the $C_{ds}$ value is approximately 25 picofarads, there is a fairly low roll-off in the frequency response of the output stage of the system of FIG. 1. In addition, due to the rather large value of the drain to gate voltage variation, $$\frac{dV_{DG}}{dt}$$

a current term of $$i = \frac{C dV_{DG}}{dt}$$

is produced where $$\frac{dV_{DG}}{dt}$$

is the time rate change of the drain-gate voltage, C is the drain to gate capacitance, with i being the resulting current which opposes that current being delivered into the gate from the resistive string. These factors add to cause a rather low speed, low frequency linear response of this output stage of FIG. 1 of around a few hundred hertz. This low frequency response characteristic causes a time-lag in each stage in the cascode string which produces an accumulative time-lag effect in successive Q1 stages up the cascode strings causing those stages closest to the L1-L2 opto-coupler devices to turn on before those MOSFET stages higher up in their respective strings. This causes an uneven voltage distribution across the cascode string leading to excessive voltage generated on the Q1 devices which have not yet had the opportunity to turn on. This causes excessive voltage to be generated between the drain and source of those devices as a result. This causes voltage break down of those devices due to operation outside of their safe operating area (SOA) ratings when operating at higher frequencies.

To help alleviate this higher frequency voltage breakdown problem, lower value of resistance in the gate resistor string could be used. However, as the gate resistor string moves to lower values of resistance, power dissipation in the string rises, leading to excessive heat generation and increased cost of the cooling equipment needed to prevent excessive temperature rise.

In current art designs using cascoded output stages, the number of separate H.V. MOSFET stages in the cascode string, as controlled by a L1 or L2 linear optocoupler device, is limited to approximately 10 to 15 stages in order to limit the accumulative time-lag effect which leads to voltage breakdown of MOSFET devices higher up on the string as described above. The control of the following 10 to 15 stages up the string is then provided by another L1 or L2 device whose input diode is placed in parallel (electrically) with the original L1 or L2 devices. This produces a number of subsets of 10 to 15 MOSFETS per subset. The number of subsets of 10 to 15 MOSFETS stages would then be provided to accommodate the total voltage stress produced across either the positive going or negative going cascode strings (i.e. the string connected between the output and the (+) H.V. supply and the string connected between the output and (−) H.V. supply). Unfortunately, the tracking of the input/output current gain ratios of all additional paralleled L1/L2 devices used must be closely held as a function of temperature and time in order to prevent the imbalance in voltage distribution that these added L1/L2 devices are designed to prevent, thus resulting in the need to use a thermistor or other temperature sensitive devices associated with each L1 or L2 controlled subset to ensure adequate voltage tracking between subsets.

Another technique which could be used to prevent the uneven voltage distribution is to employ separate ground referenced power supplies to provide low impedance low voltage sources for each Q1 MOSFET gate circuit. However, this solution is expensive due to the number of supplies needed to supply an increased number of Q1 devices in the cascode string for higher voltages outputs. In addition, each low voltage gate supply would have to have a high voltage stand-off rating insulation to prevent destructive arc-over to ground from the gate circuitry as well as special construction to keep the capacitive loading of the gate circuitry at a minimum.

SUMMARY OF THE INVENTION

Objectives of the invention of this disclosure include providing a new technique for the construction of high voltage amplifier output stages using cascoded H.V. MOSFET transistor devices which would:

A. Increase the speed and bandwidth capability of high voltage amplifier output stages using H.V. MOSFET transistors into the range of 100 kilohertz or more.

B. Obtain the higher bandwidth without the generation of increased heat due to the reduction of the gate biasing resistive networks connected into the gate circuit of each of the H.V. power MOSFET devices in the cascode string.

C. Avoid the use of separate ground referenced low impedance supplies to connect to the gate circuitry of each MOSFET devices in the cascode string.

D. Prevent the generation of excessive voltage across the MOSFET devices in the cascode string due to the accumulative turn on and turn off time lag thus preventing MOSFET device failure due to voltage breakdown or operation outside the MOSFET device's safe operating area (SOA) rating.

E. Provide for the operation of cascaded high voltage MOSFET devices which operate to produce a class "D" amplifier output stage by providing ultra-fast operation of the cascaded MOSFET devices in a pulse width modulated mode.

F. Increase the reliability and decrease the cost of high voltage, high speed/bandwidth cascoded output stages of high voltage amplifiers by using only a single L1 or L2 current control device to control the entire current through each positive side and negative side cascoded set of MOSFET devices connected between the amplifier output and the (+) H.V. and (−) H.V. supplies without the use of subsets of MOSFET device stages.

According to a first aspect of the present invention, an amplifier output stage comprising a string of sub-stages, provides each sub-stage with:

a resistor coupled to another resistor in an adjacent sub-stage or to a high DC voltage, the resistor and the other resistor forming part of a string of equal valued resistors;

a field effect transistor having a gate, a source coupled to a cathode of a Zener diode coupled in parallel with a capacitor, a drain coupled to another sub-stage in the string of sub-stages, an output node of the DC amplifier output stage, or the high DC voltage; and at least one active device coupled to the gate of the field effect transistor and coupled to the resistor for providing high impedance between a voltage on a node of the resistor and the gate of the field effect transistor and a low impedance between the at least one active device and the gate of the field effect transistor, the at least one active device coupled to both the cathode and an anode of the Zener diode.

In further accord with the first aspect of the present invention, the amplifier output stage may include one or more of the following eight structural features:

1—the string of sub-stages of the amplifier may include a positive side string of sub-stages coupled between a positive high DC voltage and the output node and a negative side string of sub-stages coupled between a negative high DC voltage and the output node;

2—the at least one active device may comprise an N channel enhancement mode MOSFET and a P channel enhancement mode MOSFET having a common source connection to the gate of the field effect transistor comprising a depletion mode N type power MOSFET and a common gate connection to the node of the resistor;

3—a charge pump may be connected in parallel with the Zener diode and the capacitor and wherein the at least one active device comprises an N channel enhancement mode MOSFET and a P channel enhancement mode MOSFET having a common source connection to the gate of the field effect transistor comprising an enhancement mode N type power MOSFET and a common gate connection to the node of the resistor;

4—the at least one active device may comprise an NPN transistor and a PNP transistor having a common emitter connection to the gate of the field effect transistor comprising a high voltage depletion mode power MOSFET and a common base connection to the node of the resistor;

5—the at least one active device comprises a buffer amplifier having an output connected to the gate of the field effect transistor comprising a high voltage depletion mode power MOSFET and an input connected to the node of the resistor;

6—a charge pump may be connected in parallel with the Zener diode and the capacitor and the at least one active device may comprise a buffer amplifier having an output connected to the gate of the field effect transistor comprising a high voltage enhancement mode power MOSFET and an input connected to the node of the resistor;

7—the string of sub-stages of the amplifier may comprise a positive side string of sub-stages connected between a positive high DC voltage and the output node and a negative side string of sub-stages connected between a negative high DC voltage and the output node wherein
an input device of the positive side string of sub-stages comprises a positive side MOSFET driver having an input coupled to a positive side pulse width modulated input signal and an output connected to a gate of a positive side input sub-stage field effect transistor coupled between the positive side string of sub-stages and the output node, and wherein
an input device of the negative side string of sub-stages comprises a negative side MOSFET driver having an input coupled to a negative side pulse width modulated input signal and an output connected to a gate of a negative side input sub-stage field effect transistor coupled between the negative side string of sub-stages and the negative high DC voltage; and 8—the anode of the Zener diode is coupled to
an input device of the amplifier output stage that is coupled to the output node of the amplifier output stage or
a drain of a field effect transistor of another sub-stage in the string of sub-stages of the amplifier output stage, wherein the amplifier output stage may further comprise another Zener diode and a capacitor coupled in parallel and coupled to the node of the resistor and the at least one active device of a sub-stage and to the output node of the amplifier output stage. In that case, the string of sub-stages of the amplifier may comprise a positive side string of sub-stages connected between a positive high DC voltage and the output node and a negative side string of sub-stages connected between a negative high DC voltage and the output node.

According to a second aspect of the present invention, an amplifier output stage includes a positive side and a negative side, wherein the positive side is for connection at a positively powered end to a positive DC high voltage and is connected at a positive side output end to an output node of the amplifier, wherein the negative side is for connection at a negatively powered end to a negative DC high voltage and is connected at a negative side output end to the output node of the amplifier, the positive side comprising a plurality of power transistors connected in a cascode configuration between the positively powered end and a positive current control device connected to the positive side output end, the negative side comprising a plurality of power transistors connected in a cascode configuration between the negative side output end and a negative current control device connected to the negatively powered end, wherein a string of equal value resistors divide the positive voltage between the output node and the positively powered end with a low positive voltage node of each resistor coupled to a control node of a corresponding power transistor among the plurality of power transistors connected in the cascode configuration between the positively powered end and the positive side output end, wherein a string of equal value resistors divide the negative voltage between the output node and the negatively powered end with a low negative voltage node of each resistor coupled to a control node of a corresponding power transistor among the plurality of power transistors connected in the cascode configuration between the negatively powered end and the negative side output end, wherein the low positive voltage node of each resistor in the positive node is coupled to the control node of the corresponding power transistor via at least one active device that provides a high impedance load on the string of equal value resistors that divide the positive voltage between the output node and the positively powered end and that provides a low impedance and high current capability to drive the control node of the corresponding power transistor, and wherein the low negative voltage side of each resistor in the negative node is coupled to the control node of the corresponding power transistor via at least one active device that provides a high impedance load on the string of equal value resistors that divide the negative voltage between the output node and the negatively powered end and that provides a low impedance and high current capability to drive the control node of the corresponding power transistor.

In further accord with the second aspect of the present invention, the amplifier may include one or more of the following four structural features:

1—the at least one active device comprises an N channel enhancement mode MOSFET and a P channel enhancement mode MOSFET having a common source connection to the gate of the field effect transistor comprising a depletion mode N type power MOSFET and a common gate connection to the low positive or negative voltage node of the resistor;

2—each positive and negative side further comprises a Zener diode in parallel with a capacitor, wherein a charge pump is connected in parallel with the Zener diode and the capacitor connected to the active device and the field effect transistor;

3—the at least one active device comprises an NPN transistor and a PNP transistor having a common emitter connection to the gate of the field effect transistor comprising a high voltage depletion mode power MOSFET and a common base connection to the node of the resistor; and 4—the at least one active device comprises a small signal NPN transistor and a small signal PNP transistor having a common emitter connection to the gate of the field effect transistor comprising a high voltage depletion mode power MOSFET and a common base connection to the node of the resistor.

The foregoing objectives and improved features provided by the present invention will become clearly apparent upon reading of the ensuing detailed disclosure here-in.

DETAILED DESCRIPTION OF EMBODIMENTS

As discussed above in the background section, FIG. 1 is a schematic representation of a prior art high voltage D.C. coupled output stage showing three Q1 MOSFET devices (cells) per positive/negative side 17, 18 in cascode connection. L1 and L2 are shown as opto-coupler devices, which at higher values of (+) H.V. and (−) H.V. voltage levels, could be replaced with higher voltage capability fiber-optic elements. Zener Z1 and capacitor C are used to limit the collector voltage on the opto-coupler transistor to prevent breakdown of the transistor device inside the opto-coupler device. Q1 of each cascaded stage (cell) could be either a depletion mode or enhancement mode MOSFET transistor device. The difference between depletion and enhancement mode is with the gate to source voltage range required for complete control of the current through the MOSFET device. For depletion mode, a gate to source voltage ($V_GS$) range of negative 5 volts to 0 volts achieves full control while for enhancement mode, a $V_GS$ voltage range of 0 to +10 volts is required.

Figures 2, 2A:
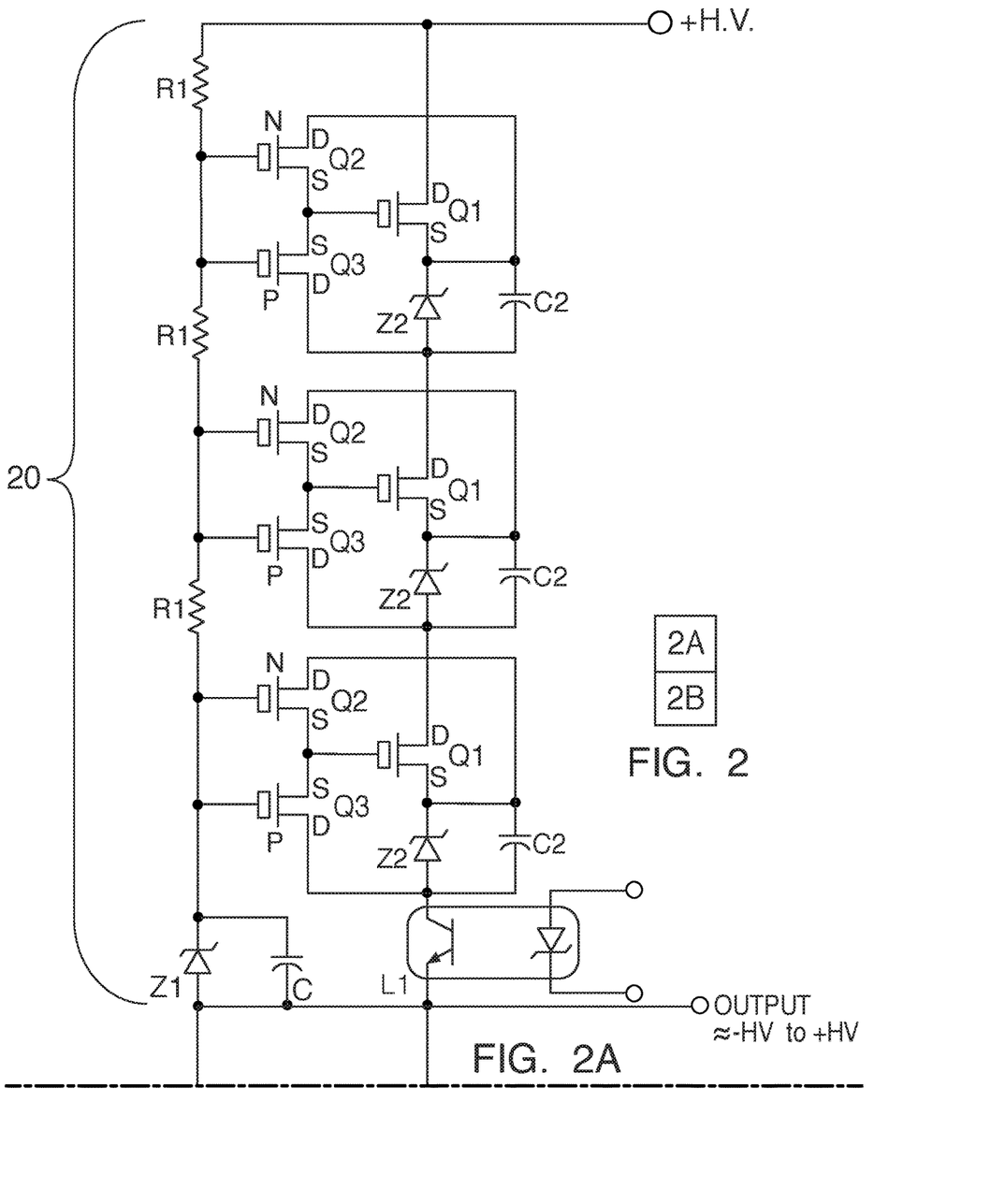
FIG. 2 shows how FIGS. 2A and 2B fit together so as to depict a schematic representation of an embodiment of a high voltage D.C. coupled output stage according to the present invention.
Figure 2B:
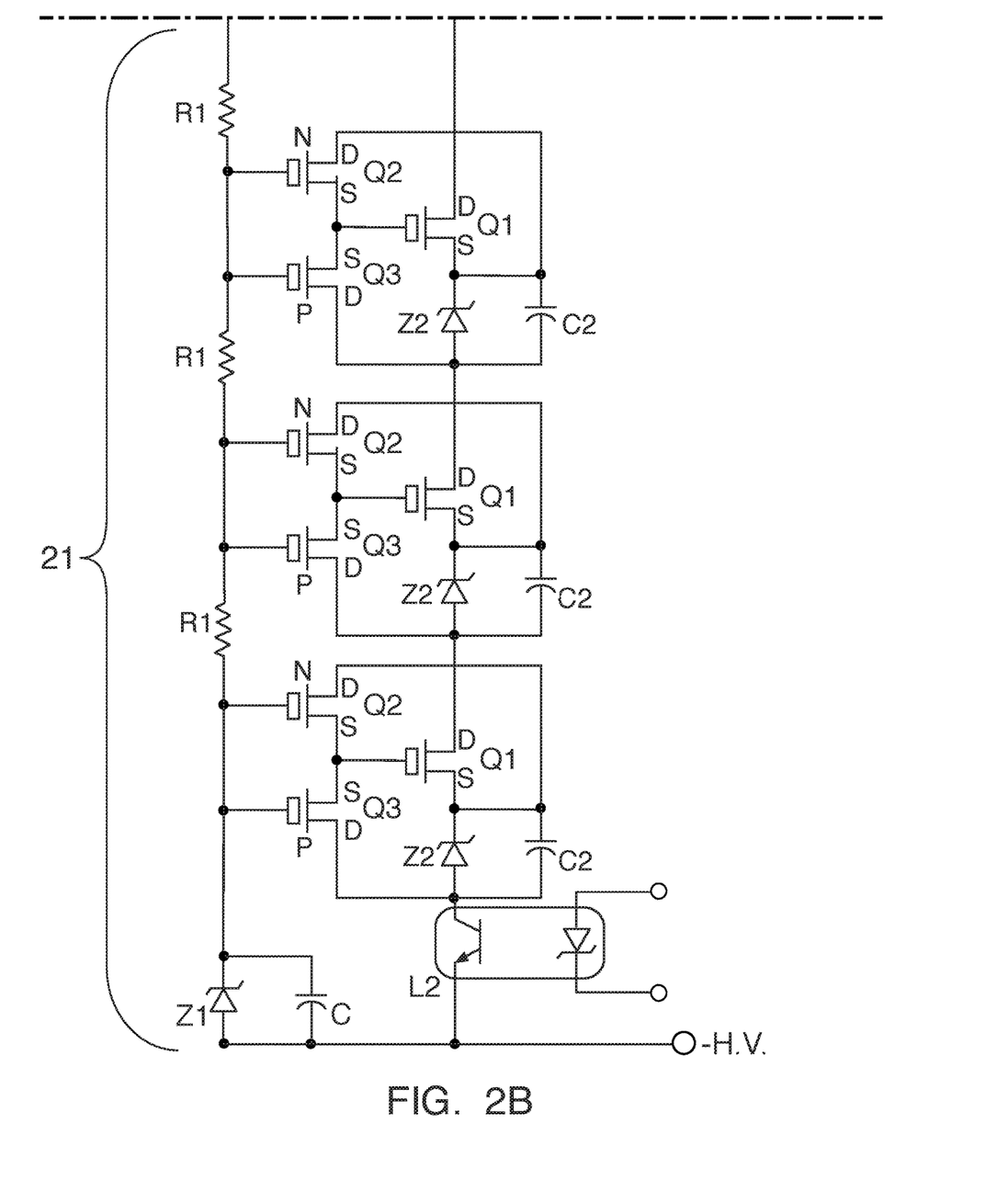

FIG. 2 shows how FIGS. 2A and 2B fit together with FIG. 2A on top of FIG. 2B. Together they present a schematical representation of the amplifier output stage of an embodiment according to the present invention with positive side 20 and negative side 21. As shown, there are three cascoded MOSFET stages Q1 (cells) on each side of the output terminal 22 to achieve an output voltage range of (−) H.V. to (+) H.V. Many more MOSFET devices can be used in cascode to achieve higher output voltage capability. In this embodiment, the MOSFET devices Q1 are depletion mode N type power MOSFET devices.

In each stage, Zener diode Z2 and capacitor C2 are used to generate, within each MOSFET stage (cell) an approximate 6V supply with the 6V supply high side output connected to the source terminal of the MOSFET of each cascaded Q1 stage (cell) and the low side output of the 6V supply connected to either the drain circuit of the preceding stage or the collector of the opto-coupler's transistor. Also shown are low power enhancement mode, small signal, N channel and P channel MOSFETs Q2 and Q3 respectively. Q2 and Q3 operated as source followers by their common gate connections to the resistive string and their common source connections to the gate circuit of the cascoded MOSFET Q1. This Q2 and Q3 common source connection produces a very low impedance of a few ohms and a high current capability to drive the Q1 MOSFET gate capacitance while the common gate terminal of Q2 and Q3 MOSFETS provide a very high impedance of a few tera ohms load on the resistor string. Any positive current required by the Q1 MOSFET gate to increase its gate voltage to produce a higher value of Q1 drain current is supplied by the charge in capacitor C2 through MOSFET Q2, while a decrease in the Q1 gate voltage is produced by current in Q3. Thus, the current is required to be supplied by the resistive string is reduced to a few picoamps.

With no loading of the resistive string by the gates of the cascoded Q1 devices, the resistive string will equally divide the voltages along the string to prevent excessive voltage to be developed across any one of the Q1 cascoded MOSFETS. This will prevent voltage breakdown or operation of the Q1 devices outside of their safe operating area (SOA) rating and thus prevent having to break-up the cascoded MOSFETS into subset groups of 10 to 15 MOSFETS per subset.

Figure 3:
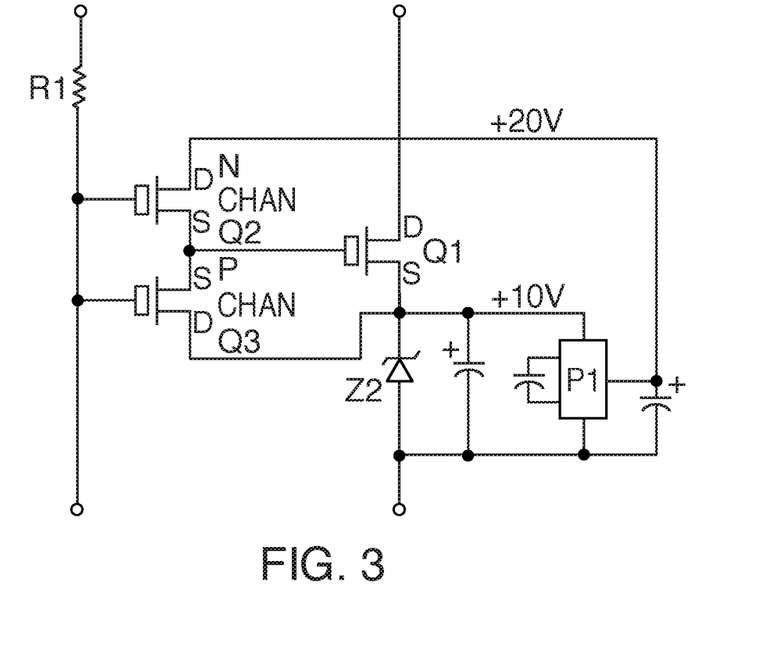
FIG. 3 shows an embodiment of a single stage of a cascode string that provides for the use of small signal N channel MOSFET (Q2) and P channel MOSFET (Q3) to drive the gate circuit of an enhancement mode power MOSFET (Q1).

As shown in FIGS. 2A and 2B, depletion mode, N type power MOSFET devices may be used in each cascoded Q1 stage. Operation of this cell using enhancement mode MOSFETs can be accomplished by using a voltage doubling charge pump I.C. (P1), as shown in FIG. 3, connected to the Zener diode Z2 in parallel with a capacitor to provide a power supply to produce a +10 volt voltage source. The resulting 10 volt power source is used together with Q2 and Q3 to apply a $V_{GS}$ gate voltage of between 0 to +10 volts, as required by enhancement mode MOSFETs if this mode device is used for Q1 (enhancement mode). Operation of this enhancement mode circuitry is the same as that described for depletion mode operation described above with the addition of a voltage doubler integrated circuit device. Thus, FIG. 3 shows the enhancement mode operation. Only a one stage (cell) is shown for brevity.

Figure 4:
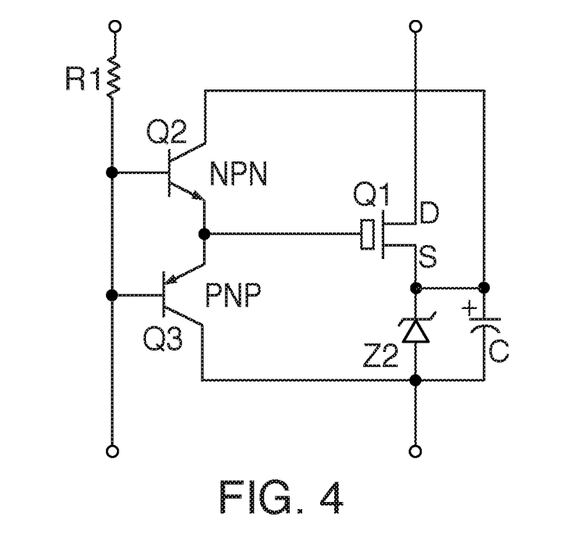
FIG. 4 shows another embodiment of a single stage of a cascode string that provides for the use of small signal NPN transistor (Q2) and PNP transistor (Q3) to drive the gate circuit of a depletion mode power MOSFET (Q1).

FIG. 4 shows another embodiment of a single stage according to the present invention which uses bipolar NPN and PNP devices as emitter followers in place of the MOSFET N channel and P channel devices shown in FIG. 2 and FIG. 3. In FIG. 4, a small signal NPN transistor and a small signal PNP transistor have a common emitter connection to the gate of a high voltage depletion mode power MOSFET (Q1) and a common base connection to the node of the resistor R1. In this embodiment, the Zener diode may be for instance a 6V device and the capacitor connected in parallel thereto may be about 0.1 microfarad. It should of course be evident, as mentioned previously, that the same type of configuration would be applicable to a unipolar implementation and although bipolar implementation is shown in FIG. 4, it should be understood that the invention is applicable to unipolar implementions.

Figure 5:
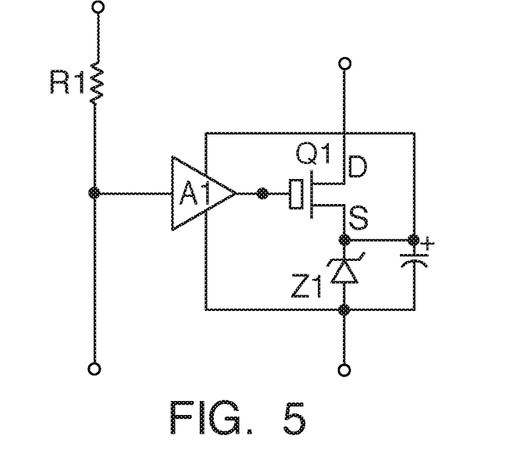
FIG. 5 shows another embodiment of a single stage of a cascode string that provides for the use of a buffer amplifier (A1) to drive the gate circuit of a depletion mode power MOSFET (Q1).

FIG. 5 shows an embodiment of the present invention which employs a buffer amplifier or operational amplifier connected as a voltage follower buffer amplifier to drive the gate of the depletion mode H.V. MOSFET Q1 while the input of the buffer amplifier or operational amplifier is connected to the resistive string. As the output impedance of the buffer or operational amplifier is a few ohms while its' input impedance is in the range of a few tera ohms, isolation of the Q2 MOSFET gate circuit from the resistive string is achieved.

Figure 6:
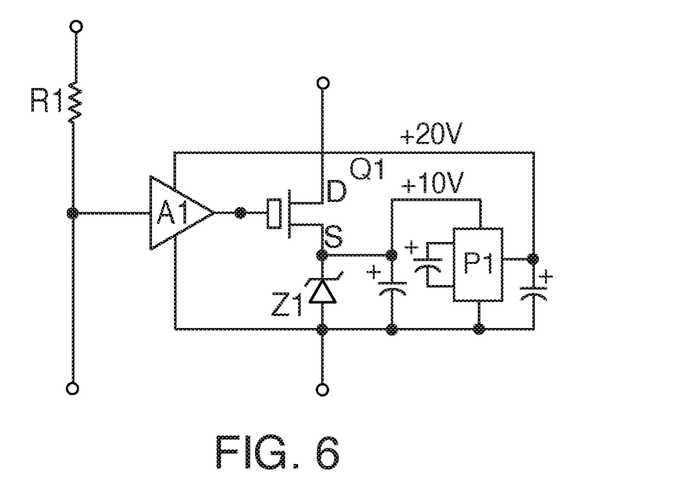
FIG. 6 shows another embodiment of a single stage of a cascode string that provides for the use of a buffer amplifier (A1) to drive the gate circuit of an enhancement mode power MOSFET (Q1).

FIG. 6 shows an embodiment of the present invention which employs a buffer or operational amplifier to drive the gate circuit of an enhancement mode H.V. MOSFET device Q1. Here again, a voltage doubling charge pump is used to develop a +10 volt voltage source to power the buffer or operational amplifier to drive the gate of Q1 over a voltage range of zero volts to +10 volts relative to the Q1 source voltage.

Figure 7:
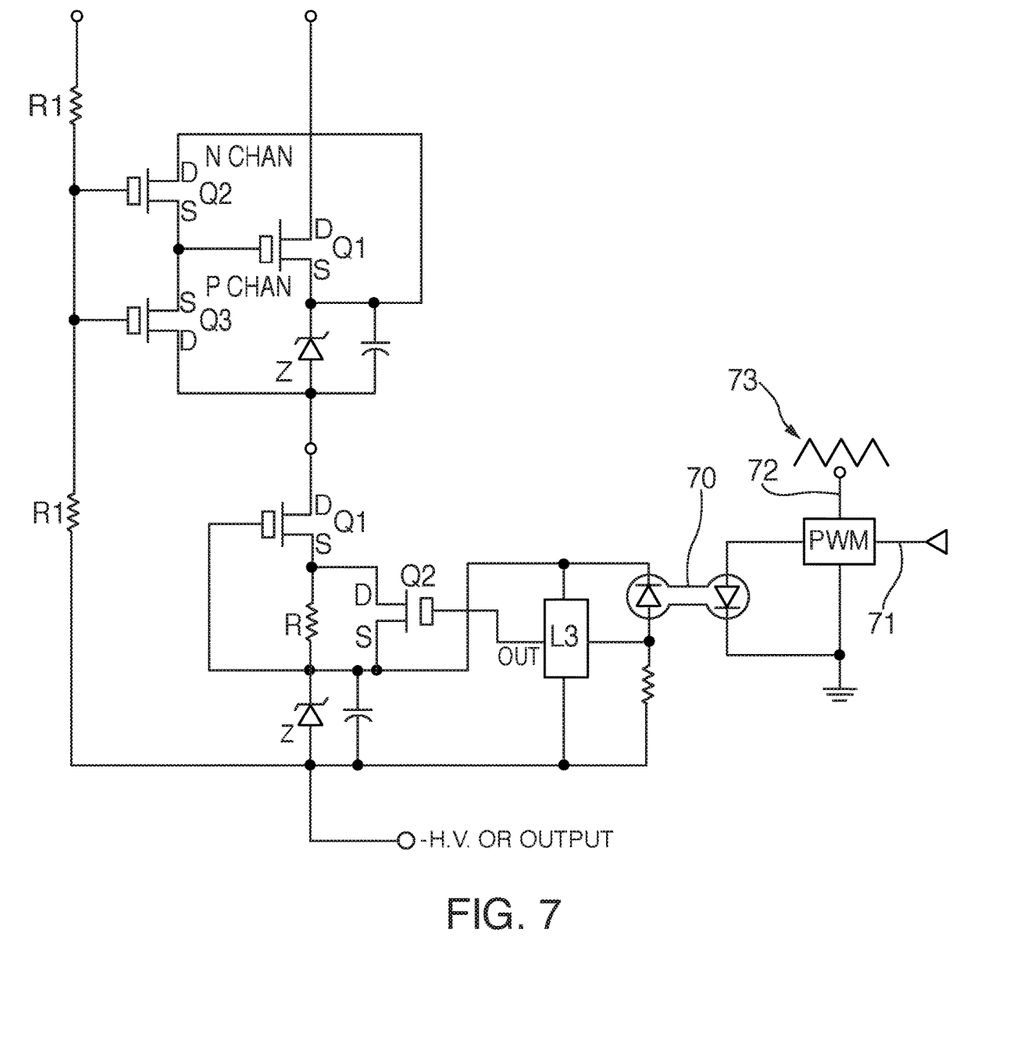
FIG. 7 shows a single stage of a cascode string connected to a current control that includes a MOSFET driver Integrated Circuit (L3) for a class D topology.

FIG. 7 shows an embodiment of the present invention in a class D configuration which employs a high current MOSFET driver integrated circuit L3. When the input voltage of L3 moves to approximately 1 volt positive, the output of L3 generates an ultra-fast signal to drive the gate of a low power, depletion mode MOSFET. A resistor R connected between the drain and source of the low power, depletion mode MOSFET establishes a quiescent current through all of the Q1 devices in the cascode string. The input voltage to L3 is generated through a fiber-optic-link 70 capable of high speed operation to drive L3 from a ground referenced pulse generator as derived from Pulse Width Modulation (PWM) circuitry that has an analog information signal applied to an input node 71 and a high-frequency triangle waveform 73 applied to another input node 72. When L3 receives a signal from the receiver of the fiber optic coupler 70, the output of L3 switches high (to the voltage value of the Zener diode (Z)) which turns on the depletion mode MOSFET Q2 (whose gate is connected to its output) and at the same time all Q1 devices in the cascode string at high speed. In this way a high voltage Pulse Width Modulated signal is produced at the output of cascoded H.V. depletion mode MOSFET output stages. This embodiment can be used as a class D High Voltage amplifier output stage. A four pole filter network can then be connected to the output terminal to recover the analog information, as conventionally known. The pulse width modulated output signal switches from (+) H.V. to (−) H.V. supplies at a very fast rate, thus the cascoded depletion mode MOSFET devices Q1 do not operate in a linear mode but in a full-on or full-off mode, so that power losses in these Q1 MOSFETs is minimized. This allows smaller less expensive Q1 MOSFET devices to be used for the Q1s as well as dramatically reducing the cost and complexity of the output stage cooling system.

All the embodiments shown for the invention here-in described have the common feature of:

A. The generation of a local supply in each Q1 cell of the MOSFET cascoded string devices whether they be enhancement or depletion mode operated devices.

B. The use of MOSFET transistors, bipolar transistors, buffer amplifiers or operational amplifiers placed between the resistor string and the gate circuits of the H.V. power MOSFETs in the cascode string dramatically reduces to a few picoamps the current flow from the string into the MOSFET gate circuitry. This allows the gates of the MOSFETs to be driven by a low impedance source to dramatically increase the speed and bandwidth capability of the MOSFET devices in the cascode connection.

C. In the case of embodiment shown in FIG. 7, to allow the cascoded MOSFET string to perform the duty of a class "D" amplifier output stage. This is accomplished by the use of a digital integrated circuit L3 having the capability to drive the gate of Q1 using a high speed digital drive signal as generated by the output of a high speed opto-coupler, or fiber-optic receiver at the end of a fiber-optic "pipe". The input to the opto-coupler, or "pipe" is from the output of a conventional ground referenced pulse-width-modulation circuit operating at a high frequency.

D. The control of the output current of a cascode connected high speed MOSFET amplifier output stage by a single control element precludes the need for multiple control element stages connected to groups or subsets of MOSFET devices due to the speed at which any particular MOSFET will produce, at its drain, an almost instantaneous replica of the current injected into its source by the preceding MOSFET drain circuit (or L1/L2 device). This almost instantaneous response is attributable to the capability of the device connected to the MOSFET gate circuit to deliver a low impedance, fast responding gate drive signal without regard to the impedance level presented by the string of resistor element values. This also prevents any voltage over-stress from appearing across any MOSFET stage of the cascode connection by keeping the MOSFET gate currents isolated from the resistor string to allow even voltage distribution along the resistive string.

It is therefore apparent that the present invention accomplishes its intended objects. While several embodiments of the present invention have been described in detail, this is for the purpose of illustration not limitation.

I claim:

1. An amplifier output stage comprising a string of sub-stages, each sub-stage comprising:
a resistor coupled to another resistor in an adjacent sub-stage or to a high DC voltage node, the resistor and the another resistor forming part of a string of equal valued resistors;
a field effect transistor having a gate, a source coupled to a cathode of a Zener diode coupled in parallel with a capacitor, a drain coupled to another sub-stage in the string of sub-stages, an output node of the amplifier output stage, or the high DC voltage node; and
at least one active device coupled to the gate of the field effect transistor and coupled to the resistor for providing high impedance between a voltage on a node of the resistor and the gate of the field effect transistor and a low impedance between the at least one active device and the gate of the field effect transistor, the at least one active device coupled to both the cathode and an anode of the Zener diode.

2. The amplifier output stage of claim 1, wherein the string of sub-stages of the amplifier output stage comprises a positive side string of sub-stages coupled between a positive high DC voltage node and the output node and a negative side string of sub-stages coupled between a negative high DC voltage node and the output node.

3. The amplifier output stage of claim 1, wherein the at least one active device comprises a N channel enhancement mode MOSFET and a P channel enhancement mode MOSFET having a common source connection to the gate of the field effect transistor and a common gate connection to the node of the resistor, wherein the field effect transistor comprises a depletion mode N type power MOSFET.

4. The amplifier output stage of claim 1, wherein a charge pump is connected in parallel with the Zener diode and the capacitor and wherein the at least one active device comprises a N channel enhancement mode MOSFET and a P channel enhancement mode MOSFET having a common source connection to the gate of the field effect transistor and a common gate connection to the node of the resistor, wherein the field effect transistor comprises a depletion mode N type power MOSFET.

5. The amplifier output stage of claim 1, wherein the at least one active device comprises a NPN transistor and a PNP transistor having a common emitter connection to the gate of the field effect transistor and a common base connection to the node of the resistor, wherein the field effect transistor comprises high voltage depletion mode power MOSFET.

6. The amplifier output stage of claim 1, wherein the at least one active device comprises a buffer amplifier having an output connected to the gate of the field effect transistor and an input connected to the node of the resistor, wherein the field effect transistor comprises a high voltage depletion mode power MOSFET.

7. The amplifier output stage of claim 1, wherein a charge pump is connected in parallel with the Zener diode and the capacitor and wherein the at least one active device comprises a buffer amplifier having an output connected to the gate of the field effect transistor and an input connected to the node of the resistor, wherein the field effect transistor comprises a high voltage depletion mode power MOSFET.

8. The amplifier output stage of claim 1, wherein the string of sub-stages of the amplifier output stage comprises a positive side string of sub-stages connected between a positive high DC voltage node and the output node and a negative side string of sub-stages connected between a negative high DC voltage node and the output node wherein
an input device of the positive side string of sub-stages comprises a positive side MOSFET driver having an input coupled to a positive side pulse width modulated input signal and an output connected to a gate of a positive side input sub-stage field effect transistor coupled between the positive side string of sub-stages and the output node, and wherein
an input device of the negative side string of sub-stages comprises a negative side MOSFET driver having an input coupled to a negative side pulse width modulated input signal and an output connected to a gate of a negative side input sub-stage field effect transistor coupled between the negative side string of sub-stages and the negative high DC voltage node.

9. The amplifier output stage of claim 1, wherein the anode of the Zener diode is coupled to
an input device of the amplifier output stage that is coupled to the output node of the amplifier output stage or
a drain of a field effect transistor of another sub-stage in the string of sub-stages of the amplifier output stage.

10. The amplifier output stage of claim 9, further comprising another Zener diode and a capacitor coupled in parallel and coupled to the node of the resistor and the at least one active device of a sub-stage and to the output node of the amplifier output stage.

11. The amplifier output stage of claim 10, wherein the string of sub-stages of the amplifier output stage comprises a positive side string of sub-stages connected between a positive high DC voltage node and the output node and a negative side string of sub-stages connected between a negative high DC voltage node and the output node.

12. An amplifier output stage comprising a positive side and a negative side,
wherein the positive side is for connection at a positively powered end to a positive DC high voltage node and is connected at a positive side output end to an output node of the amplifier output stage,
wherein the negative side is for connection at a negatively powered end to a negative DC high voltage node and is connected at a negative side output end to the output node of the amplifier output stage,
the positive side comprising a plurality of power transistors connected in a cascode configuration between the positively powered end and a positive current control device connected to the positive side output end,
the negative side comprising a plurality of power transistors connected in a cascode configuration between the negative side output end and a negative current control device connected to the negatively powered end,
wherein a string of equal value resistors divide the positive voltage between the output node and the positively powered end with a low positive voltage node of each resistor coupled to a control node of a corresponding power transistor among the plurality of power transistors connected in the cascode configuration between the positively powered end and the positive side output end,
wherein a string of equal value resistors divide the negative voltage between the output node and the negatively powered end with a low negative voltage node of each resistor coupled to a control node of a corresponding power transistor among the plurality of power transistors connected in the cascode configuration between the negatively powered end and the negative side output end,
wherein the low positive voltage node of each resistor in the positive node is coupled to the control node of the corresponding power transistor via at least one active device that provides a high impedance load on the string of equal value resistors that divide the positive voltage between the output node and the positively powered end and that provides a low impedance and high current capability to drive the control node of the corresponding power transistor, and
wherein the low negative voltage side of each resistor in the negative node is coupled to the control node of the corresponding power transistor via at least one active device that provides a high impedance load on the string of equal value resistors that divide the negative voltage between the output node and the negatively powered end and that provides a low impedance and high current capability to drive the control node of the corresponding power transistor.

13. The amplifier output stage of claim 12, wherein the at least one active device comprises a N channel enhancement mode MOSFET and a P channel enhancement mode MOSFET having a common source connection to the control node of the corresponding power transistor and a common gate connection to the low positive or negative voltage node of the resistor, wherein the power transistor comprises a depletion mode N type power MOSFET and the control node comprises a gate of the depletion mode N type power MOSFET.

14. The amplifier output stage of claim 12, further comprising a Zener diode in parallel with a capacitor, wherein a charge pump is connected in parallel with the Zener diode and the capacitor connected to the active device and the power transistor.

15. The amplifier output stage of claim 12, wherein the at least one active device comprises a NPN transistor and a PNP transistor having a common emitter connection to the control node of the power transistor and a common base connection to the node of the resistor, wherein the power transistor is a high voltage depletion mode power MOSFET and the control node comprises a gate of the depletion mode power MOSFET.

16. The amplifier output stage of claim 12, wherein the at least one active device comprises a buffer amplifier having an output connected to the control node of the power transistor and an input connected to the node of the resistor, wherein the power transistor is a high voltage depletion mode power MOSFET and the control node comprises a gate of the high voltage depletion mode power MOSFET.

* * * * *